United States Patent
Liao et al.

(10) Patent No.: US 12,532,584 B2
(45) Date of Patent: Jan. 20, 2026

(54) LIGHT-EMITTING DEVICE

(71) Applicant: XIAMEN SAN'AN OPTOELECTRONICS CO., LTD., Xiamen (CN)

(72) Inventors: Qihua Liao, Xiamen (CN); Zhendong Wei, Xiamen (CN); Zhiying Zheng, Xiamen (CN); Chunhsien Lee, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 430 days.

(21) Appl. No.: 18/089,391

(22) Filed: Dec. 27, 2022

(65) Prior Publication Data
US 2023/0395757 A1    Dec. 7, 2023

(30) Foreign Application Priority Data
Jun. 1, 2022   (CN) .......................... 202210616589.2

(51) Int. Cl.
*H10H 20/84*   (2025.01)
*H10H 20/831*  (2025.01)
*H10H 20/832*  (2025.01)

(52) U.S. Cl.
CPC .......... *H10H 20/84* (2025.01); *H10H 20/835* (2025.01); *H10H 20/831* (2025.01)

(58) Field of Classification Search
CPC .... H10H 20/84; H10H 20/835; H10H 20/816; H10H 20/831; H10H 20/8162;
(Continued)

(56) References Cited

U.S. PATENT DOCUMENTS 6,794,690 B2 *  9/2004  Uemura ............... H10H 20/832
                                                         257/293
9,024,351 B2 *  5/2015  Tu ......................... H10H 20/84
                                                          438/38
(Continued)

FOREIGN PATENT DOCUMENTS

CN       213845300 U  *  7/2021
CN       114551678 A  *  5/2022
(Continued)

*Primary Examiner* — Earl N Taylor
(74) *Attorney, Agent, or Firm* — MUNCY, GEISSLER, OLDS & LOWE, P.C.

(57) ABSTRACT

A light-emitting device includes a light-emitting laminated structure, an electrode structure that is disposed on the light-emitting laminated structure, an insulation layer that is disposed on the light-emitting laminated structure, and a blocking layer structure that is interposed between the electrode structure and the insulation layer. The light-emitting laminated structure includes a first type semiconductor layer, a second type semiconductor layer, and an active layer that is interposed between the first type semiconductor layer and the second type semiconductor layer and is configured to emit light. The blocking layer structure has a first section and a second section that forms a continuous structure with the first section. The first section is interposed between a side wall of the electrode structure and the insulation layer, and the second section is interposed between the insulation layer and the light-emitting laminated structure.

12 Claims, 9 Drawing Sheets

(58) Field of Classification Search
CPC ..... H10H 20/832; H01L 33/44; H01L 33/405; H01L 33/40; H01L 33/38; H01L 33/14; H01L 33/145
See application file for complete search history.

(56) References Cited

U.S. PATENT DOCUMENTS

| | | | |
|---|---|---|---|
| 10,074,773 B2 * | 9/2018 | Sim | H10H 20/831 |
| 2012/0049232 A1 * | 3/2012 | Okabe | H10H 20/835 |
| | | | 257/98 |
| 2012/0235204 A1 * | 9/2012 | Hodota | H10H 20/835 |
| | | | 257/E33.068 |
| 2012/0248405 A1 * | 10/2012 | Tu | H10H 20/84 |
| | | | 257/13 |
| 2017/0317216 A1 * | 11/2017 | Lee | H10D 86/451 |
| 2018/0076355 A1 * | 3/2018 | Hayashi | H10H 20/84 |
| 2019/0051763 A1 * | 2/2019 | Shimatani | H10F 77/1223 |
| 2022/0230997 A1 * | 7/2022 | Choi | H01L 24/95 |
| 2023/0017727 A1 * | 1/2023 | Lin | H10H 20/84 |
| 2023/0077691 A1 * | 3/2023 | Zhu | H10H 20/8312 |
| | | | 257/634 |
| 2024/0170610 A1 * | 5/2024 | Cho | H10H 20/841 |
| 2024/0387779 A2 * | 11/2024 | Lin | H10H 20/84 |

FOREIGN PATENT DOCUMENTS

| | | | | |
|---|---|---|---|---|
| JP | 2024092493 A | * | 7/2024 | |
| WO | WO-2021184310 A1 | * | 9/2021 | H01L 33/06 |

* cited by examiner

LIGHT-EMITTING DEVICE

CROSS-REFERENCE TO RELATED APPLICATION

This application claims priority of Chinese Patent Application No. 202210616589.2, filed on Jun. 1, 2022.

FIELD

The present disclosure relates to a semiconductor optoelectronic device, and more particularly to a light-emitting device.

BACKGROUND

Light-emitting diode is a type of semiconductor optoelectronic device that may emit light by releasing energy in the form of photons upon recombination of electrons with electron holes. The light-emitting diode is widely applied in several fields (e.g., illumination, optical communication, display, etc.) for its advantageous characteristics, e.g., low power consumption, pure chromaticity, long lifespan, fast response time, and eco-friendliness, etc.

In conventional light-emitting diodes, a silicon dioxide ($SiO_2$) material is usually used to form an insulation layer. However, such an insulation layer lacks high compactness and exhibits low adhesion property with a metal material. Hence, the insulation layer is prone to intrusion of moisture and electrolytes so a metal electrode of the light-emitting diode may peel off after long-term use. As coverage of the insulation layer on the metal electrode deteriorates, metal atoms would lose protection and may easily migrate from a p-type electrode to an n-type electrode in an applied electric field.

Figure 1:
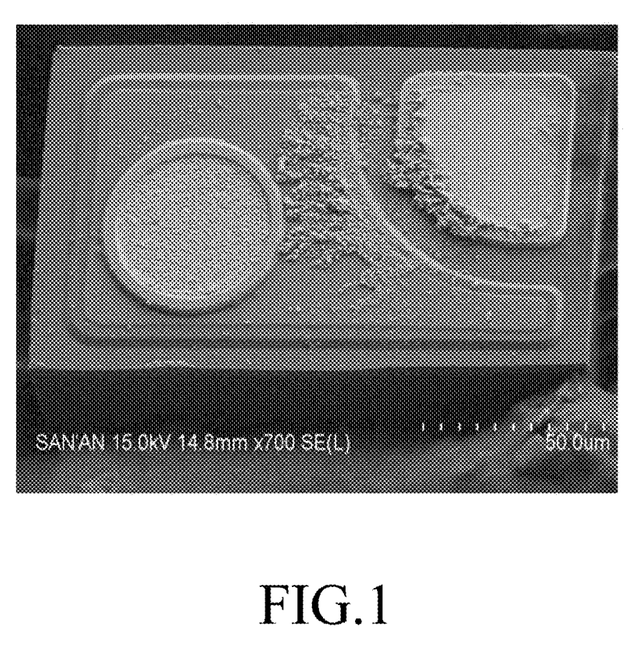
FIG. 1 is a scanning electron microscope (SEM) diagram of a conventional light-emitting diode.

FIG. 1 is a scanning electron microscope (SEM) diagram of the conventional light-emitting diode that shows a common metal migration occurring in the conventional light-emitting diode, in which the metal electrode of the light-emitting diode experiences migration of relatively high active metals such as chromium, nickel, aluminum, etc., or even gold that has a high specific gravity. If this migration occurs continuously, it would cause current leakage at an edge of a quantum well layer (i.e., an active layer) and short circuit of the light-emitting diode; the metal electrode may even peel off if the migration of Cr, Ni, Al and Au is exacerbated. Therefore, in the conventional light-emitting diode, in order to resolve the aforesaid problems, an adhesive layer (i.e., a thin titanium layer) is disposed between the insulation layer and the metal electrode to enhance the adhesion therebetween. However, the thin titanium layer is still unable to completely protect a side wall of the metal electrode from the intrusion of moisture. Thus, chromium, nickel, aluminum, and gold of the metal electrode would still migrate when the light-emitting diode is in use.

SUMMARY

Therefore, an object of the disclosure is to provide a light-emitting device that can alleviate at least one of the drawbacks of the prior art.

According to the disclosure, a light-emitting device includes a light-emitting laminated structure, an electrode structure, an insulation layer, and a blocking layer structure. The light-emitting laminated structure includes a first type semiconductor layer, a second type semiconductor layer, and an active layer that is interposed between the first type semiconductor layer and the second type semiconductor layer and is configured to emit light. The electrode structure is disposed on the light-emitting laminated structure. The insulation layer is disposed on the light-emitting laminated structure. The blocking layer structure is interposed between the electrode structure and the insulation layer. The blocking layer structure has a first section and a second section that forms a continuous structure with the first section. The first section is interposed between a side wall of the electrode structure and the insulation layer, and the second section is interposed between the insulation layer and the light-emitting laminated structure.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
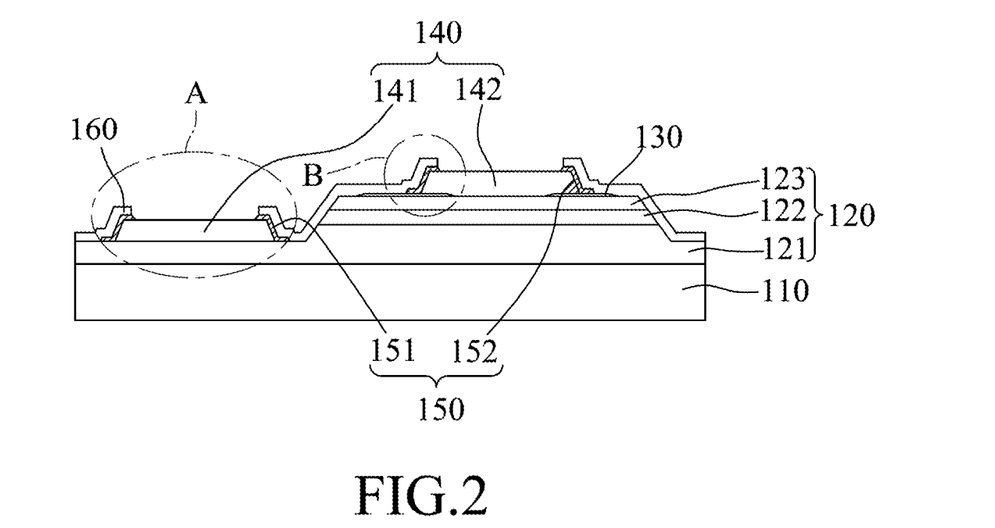
FIG. 2 is a sectional view illustrating a light-emitting device of a first embodiment according to the disclosure.

FIG. 2 is a sectional view illustrating a light-emitting device of a first embodiment according to the disclosure. Referring to FIG. 2, the light-emitting device of the first embodiment includes a substrate 110, a light-emitting laminated structure 120, a current spreading layer 130, an electrode structure 140, a blocking layer structure 150, and an insulation layer 160.

The substrate 110 may be an insulating substrate, and may be made from a transparent material, a semi-transparent material, a non-transparent material, but is not limited thereto. In this embodiment, the substrate 110 is a sapphire substrate (i.e., an aluminum oxide ($Al_2O_3$) substrate). In certain embodiments, the substrate 110 is a patterned sapphire substrate. In some embodiments, the substrate 110 may be made from a conducting material or a semiconductor material. For instance, the substrate 10 is made from a material selected from the group consisting of silicon carbide (SiC), silicon (Si), magnesium aluminum oxide (MgAl$_2$O$_4$), magnesium oxide (MgO), lithium aluminum oxide (LiAlO$_2$), gallium nitride (GaN), and combinations thereof. In some embodiments, the substrate 10 may be thinned or removed to obtain a thin-film light-emitting device 1.

In some embodiments, a top surface of the substrate 110 is entirely formed with pattern structures (not shown in the Figure) that are used to enhance light extraction efficiency of the light-emitting device and a crystallinity of the light-emitting laminated structure 120 (to be described), but is not limited thereto. In certain embodiments, the pattern structures may be omitted or formed on some certain regions of the top surface of the substrate 110. It should be noted that, the pattern structures may have a shape such as a frustum shape, a circular cone shape, a triangular pyramid shape, a hexagonal pyramid shape, a circular cone-like shape, a triangular pyramid-like shape, a hexagonal pyramid-like shape, etc., but are not limited thereto. The pattern structures and the substrate 110 may be made from the same material or different materials. In some embodiments, the pattern structures are made from a material (e.g., silicon dioxide (SiO$_2$)) having a refractive index of less than that of the substrate 110, so as to facilitate light extraction.

The light-emitting laminated structure 120 is formed on the substrate 10 (i.e., the top surface of the substrate 10) by epitaxy such as metalorganic chemical vapor deposition (MOCVD), molecular beam epitaxy (MBE), hydride vapor phase epitaxy (HYPE), physical vapor deposition (PVD), ion plating, etc., but is not limited to thus. In this embodiments, the light-emitting laminated structure 120 includes a first type semiconductor layer 121, an active layer 122 (also called light-emitting layer), and a second type semiconductor layer 123 that are stacked on one another in such order from the top surface of the substrate 110. In some embodiments, the light-emitting laminated structure 120 and the substrate 110 are interconnected through a bonding layer that is made from a transparent material.

The first type semiconductor layer 121 is doped with a first conductivity type dopant, and the second type semiconductor layer 123 is doped with a second conductivity type dopant that is opposite in conductivity type to the first conductivity type dopant. For instance, the first type semiconductor layer 121 may be doped with an n-type dopant providing electrons, and the second type semiconductor layer 123 may be doped with a p-type dopant providing holes, and vice versa. In this embodiment, the first type semiconductor layer 121 is an n-type semiconductor layer, and the second type semiconductor layer 123 is a p-type semiconductor layer. The n-type semiconductor layer may be an n-type nitride semiconductor layer that is doped with group IV element, and the p-type semiconductor layer may be a p-type nitride semiconductor layer that is doped with group II element or other suitable dopants. For instance, the first type semiconductor layer 121 (i.e., the n-type semiconductor layer) is doped with silicon (Si), germanium (Ge), tin (Sn), and combinations thereof, and the second type semiconductor layer 123 (i.e., the p-type semiconductor layer) is doped with magnesium (Mg), zinc (Zn), beryllium (Be), and combinations thereof. It should be noted that, each of the first type semiconductor layer 121 and the second type semiconductor layer 123 may be formed as a single-layer structure, or a multi-layered structure having different compositions.

The active layer 122 may emit light that has a predetermined wavelength (e.g., blue light, green light, red light, violet light, ultra-violet light, etc.). In this embodiment, the active layer 122 is configured to emit blue light. It should be noted that, the active layer 122 may be formed to have a single quantum well structure or a multiple quantum well (MQW) structure. The multiple quantum well structure includes a plurality of well layers and a plurality of barrier layers that are stacked on one another alternately. The barrier layer may be a layer that is made from gallium nitride, aluminum gallium nitride (AlGaN), or other suitable materials. In some embodiments, the active layer 122 is formed as a multiple quantum well structure that may be a paired structure including gallium nitride/aluminum gallium nitride, indium aluminum gallium nitride (InAlGaN)/indium aluminum gallium nitride structure, or indium gallium nitride (InGaN)/aluminum gallium nitride. It should be noted that, by adjusting a depth of the quantum well, the number of paired stacks of the well layers and the barrier layers, a thickness of the paired stacks, or other characteristics of the quantum well structure, enhancement of light-emitting efficiency of the active layer 122 may be achieved.

However, the configuration of the light-emitting laminated structure 120 is not limited to the aforesaid materials or structures, in other embodiments, other suitable types of material or structure may be selected according to actual requirements.

In some embodiments, the light-emitting device further includes a buffer layer (not shown in the Figures) that is disposed between the substrate 110 and the light-emitting laminated structure 120 to reduce lattice mismatch between the substrate 110 and the first type semiconductor layer 121. In some embodiments, the buffer layer is formed to have an undoped gallium nitride (u-GaN) layer or an undoped aluminum gallium nitride (u-AlGaN) layer.

The buffer layer may be formed as a single layer structure or a multi-layered structure, and is formed by epitaxy such as metalorganic chemical vapor deposition (MOCVD), molecular beam epitaxy (MBE), physical vapor deposition (PVD), etc., but is not limited to thus. The method of physical vapor deposition may include sputtering deposition (e.g., reactive sputtering, etc.) or evaporation deposition (e.g., beam vapor deposition, thermal evaporation, etc.). In this embodiment, the buffer layer includes an aluminum nitride (AlN) layer that is formed by sputtering deposition, and the aluminum nitride layer is formed on the pattern structure of the substrate 10. The method of sputtering deposition may allow the buffer layer to have characteristics such as high uniformity and high compactness, so the buffer layer may be formed on the pattern structure of the substrate 10.

The current spreading layer 130 is disposed on the light-emitting laminated structure 120 opposite to the substrate 110, and is in contact with the second type semiconductor layer 123 of the light-emitting laminated structure 120. The current spreading layer 130 is used to enhance current spreading and form an ohmic contact with the second type semiconductor layer 123. Furthermore, the current spreading layer 130 may be made from a material selected from the indium tin oxide (ITO), indium (III) oxide (In$_2$O$_3$), tin dioxide (SnO$_2$), cadmium tin oxide (CTO), antimony tin oxide (ATO), zinc oxide (ZnO), gallium phosphide (GaP), and combinations thereof, and is formed by the sputtering deposition or the evaporation deposition. In this embodiments, the current spreading layer 130 has a thickness ranging from 5 nm to 500 nm. In certain embodiments, the thickness of the current spreading layer 130 ranges from 50 nm to 300 nm.

The electrode structure 140 is disposed on the light-emitting laminated structure 120, and includes a first electrode 141 and a second electrode 142. The first electrode 141 is disposed on the first type semiconductor layer 121 of the light-emitting laminated structure 120 and is electrically connected to the first type semiconductor layer 121. The second electrode 142 is disposed on the current spreading layer 130 and is in contact with the second type semiconductor layer 123 of the light-emitting laminated structure 120 by extending through the current spreading layer 130 so that the second electrode 142 is electrically connected to the second type semiconductor layer 123. Each of the first electrode 141 and the second electrode 142 is made from a metal material having high reflectivity and high conductivity such as aluminum (Al), copper (Cu), silver (Ag), gold (Au), platinum (Pt), or combinations thereof.

Figure 3:
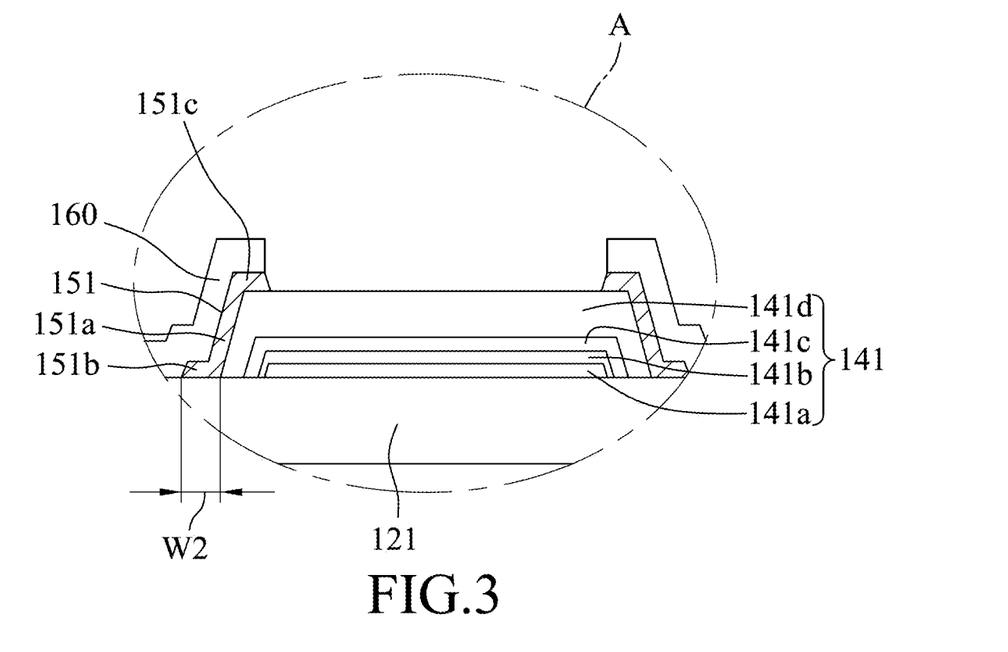
FIG. 3 is an enlarged view of a region A of FIG. 2.
Figure 4:
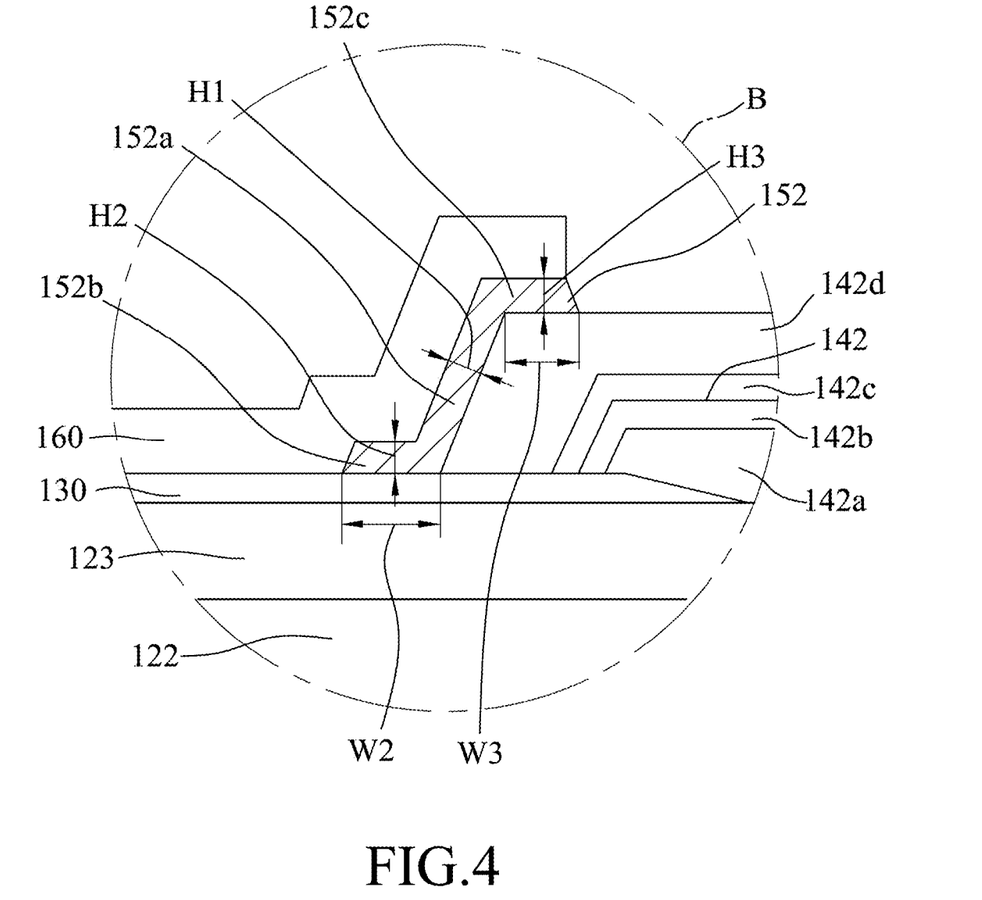
FIG. 4 is an enlarged view of a region B of FIG. 2.

FIGS. 3 and 4 are enlarged views of a region A and region B of FIG. 1 respectively. Referring to FIGS. 3 and 4, the electrode structure 140 (i.e., each of the first electrode 141 and the second electrode 142) has a first metal layer 141a, 142a, a second metal layer 141b, 142b, and a third metal layer 141d, 142d. The first metal layer 141a, 142a is disposed on the light-emitting laminated structure 120 and is in contact with the first type semiconductor layer 121 or the second type semiconductor layer 123 of the light-emitting laminated structure 120 (i.e., the first metal layer 141a of the first electrode 141 is in contact with the first type semiconductor layer 121, and the first metal layer 142a of the second electrode 142 is in contact with the second type semiconductor layer 123). The second metal layer 141b, 142b is disposed between the first metal layer 141a, 142a and the third metal layers 141d, 142d and covers the first metal layer 141a, 142a. The third metal layer 141d, 142d covers the first metal layer 141a, 142a and the second metal layer 141b, 142b, and is in contact with the blocking layer structure 150 (to be described). In some embodiments, the electrode structure 140 further has a forth metal layer 141c, 142c that is disposed between the second metal layer 141b, 142b and the third metal layers 141d, 142d and covers the first metal layer 141a, 142a and the second metal layer 141b, 142b.

Each of the first metal layers 141a, 142a is made from a material selected from the group consisting of chromium, titanium, nickel, and combinations thereof, so as to enhance adhesion between the first metal layers 141a, 142a and the light-emitting laminated structure 120. Each of the second metal layers 141b, 142b is made from a material selected from the group consisting of aluminum, silver, platinum, and an aluminum-silver alloy, to serve as a reflection layer. Each of the third metal layers 141d, 142d is made from gold, platinum, or combinations thereof, which is used for wire bonding with external elements. In this embodiment, the third metal layer 141d, 142d is formed from gold. Each of the forth metal layers 141c, 142c is made from a material such as a titanium-platinum alloy, a nickel-platinum alloy, or other suitable materials, to protect aluminum that may easily be oxidized and to avoid migration of metals such as aluminum, chromium, etc.

Referring to FIGS. 2 to 4, the blocking layer structure 150 is disposed on the electrode structure 140, and is configured to cover a side wall of the electrode structure 140, a portion of the light-emitting laminated structure 120 adjacent to the electrode structure 140, and a portion of the current spreading layer 130 adjacent to the electrode structure 140. Particularly, the blocking layer structure 150 includes a first blocking layer 151 that is in contact with the first electrode 141, and a second blocking layer 152 that is in contact with the second electrode 142. The insulation layer 160 is disposed on the light-emitting laminated structure 120. Specifically, the insulation layer 160 covers a top surface and a side wall of the light-emitting laminated structure 120, the current spreading layer 130, the electrode structure 140, and the blocking layer structure 150. The blocking layer structure 150 is interposed between the electrode structure 140 and the insulation layer 160.

Referring to FIG. 4, the second blocking layer 152 is divided into a first section 152a and a second section 152b that forms a continuous structure with the first section 152a. The first section 152a covers and is in contact with the side wall of the second electrode 142 of the electrode structure 140. The second section 152b covers and is in contact with the current spreading layer 130 adjacent to the second electrode 142; particularly, the second section 152b is in surface contact with the current spreading layer 130. The first section 152a extends downward from the side wall of the second electrode 142 to the second section 152b that is located on a portion of a top surface of the current spreading layer 130 adjacent to the side wall, and is interposed between the side wall of the second electrode 142 and the insulation layer 160. The second section 152b is interposed between the insulation layer 160 and the second type semiconductor layer 123 of the light-emitting laminated structure 120. Generally, due to limitations in the production of the light-emitting device, a portion of the insulation layer 160 that covers the side wall of the first or second electrode 141, 142 may have a relatively thin thickness, so gold migration is likely to occur at the side wall of the second electrode 142. Thus, by disposing the first section 152a of the second blocking layer 152, the aforesaid problem may be resolved. Furthermore, since the gold contained at a bottom portion of the second electrode 142 (i.e., a bottom portion of the third metal layer 142d) is closer in distance to a location where electromigration occurs than that of the gold contained at the side wall of the second electrode 142 (i.e., buckets effect), by forming the second section 152b that forms the continuous structure with the first section 152a on the portion of the current spreading layer 130 adjacent to the side wall of the second electrode 142, occurrence of gold migration at the bottom portion of the second electrode 142 may be avoided. If gold migration occurs at the bottom portion of the second electrode 142, the metal materials (e.g. aluminum, chromium and/or nickel) that are covered by gold may be damaged or corroded, reliability of the light-emitting device may be affected and failure of the light-emitting device may result. In the conventional light-emitting diode, only a thin adhesion layer is disposed on the side surface of the electrode, which is unable to block the metal migration occurring in the electrode, especially at the bottom of the electrode.

In this embodiment, referring to the FIG. 4, the second section 152b of the second blocking layer 152 further contacts with the third metal layer 142d of the second electrode 142 and also forms the continuous structure with the first section 152a of the second blocking layer 152. By such configuration, external moisture may not permeate into the second electrode 142, and gold migration occurring at the bottom portion of the second electrode 142 may be effectively avoided.

In this embodiment, referring to FIG. 4, the second section 152b of the second electrode 152 of the blocking layer structure 150 has a width (W2) of greater than 0.5 μm. In certain embodiments, the width (W2) of the second section 152b ranges from 0.5 μm to 15 μm, e.g., 0.5 μm, 1 μm, 2 μm, 3 μm, 4 μm, μm, 6 μm, 7 μm, 8 μm, 9 μm, 10 μm, 11 μm, 12 μm, 13 μm, 14 μm, or 15 μm. If the width (W2) of the second section 152b is less than 0.5 μm, the continuous structure formed by the first section 152a and the second section 152b of the second blocking layer 152 may not be able to avoid intrusion of moisture that may cause gold migration at the bottom of the second electrode 142; and if the width (W2) of the second section 152b is greater than 15 µm, the second section 152b of the second blocking layer 152 that is located on the current spreading layer 130 may adversely affect the light extraction efficiency of the light-emitting device.

In this embodiment, referring to FIG. 4, in the second blocking layer 152 of the blocking layer structure 150, each of the first section 152a and the second section 152b has a thickness (H1, H2) of not less than 30 Å. Due to the limitations in the production of the light-emitting device, the thickness (H2) of the second section 152b is greater than or equal to the thickness (H1) of the first section 152a. In certain embodiments, the thickness (H1) of the first section 152a ranges from 30 Å to 700 Å, e.g., 30 Å, 80 Å, 100 Å, 150 Å, 200 Å, 300 Å, 400 Å, 500 Å, 600 Å, or 700 Å; the thickness (H2) of the second section 152b ranges from 80 Å to 1000 Å, e.g., 80 Å, 100 Å, 150 Å, 200 Å, 300 Å, 400 Å, 500 Å, 600 Å, 700 Å, 800 Å, or 1000 Å.

Since gold migration is more likely to occur at the bottom portion of the second electrode 142 compared to the side wall of the second electrode 142, the width (W2) of the second section 152b is not less than (i.e., greater than or equal to) 5 times of the thickness (H1) of the first section 152a. In certain embodiments, the width (W2) of the second section 152b is not less than 10, 15, or 50 times of the thickness (H1) of the first section 152a.

In some embodiments, referring to FIG. 4, the second blocking layer 152 further has a third section 152c that is connected to the first section 152a and covers a portion (i.e., an edge portion) of a top surface of the second electrode 142 of the electrode structure 140 distal from the light-emitting laminated structure 120. The third section 152c forms continuously with the first section 152a and the second section 152b. By such configuration, protection of the gold layer of the second electrode 142 may be further enhanced to avoid gold migration. The third section 152c has a width (W3) of not greater than 5 µm. In certain embodiments, the width (W3) ranges from 0.2 µm to 3 µm, e.g., 0.2 µm, 0.5 µm, 1 µm, 2 µm, or 3 µm. If the width (W3) of the third section 152c is greater than 5 µm, an area of the top surface of the second electrode 142 that is exposed from the second blocking layer 152 would be too small, which may adversely affect subsequent wire bonding and the reliability of the light-emitting device. In addition, the third section 152c has a thickness (H3) of not less than 30 Å. In certain embodiments, the thickness (H3) of the third section 152c may be the same or different from the thickness (H2) of the second section 152b.

In this embodiment, the second blocking layer 152 is made from a material selected from the group consisting of chromium (Cr), titanium (Ti), platinum (Pt), palladium (Pd), osmium (Os), iridium (Ir), ruthenium (Ru), rhodium (Rh), and combinations thereof. The second blocking layer 152 not only may avoid gold migration occurring at the bottom of the second electrode 142 but also may enhance adhesion between the insulation layer 160 and the second electrode 142, so as to prevent peeling of the insulation layer 160 from the electrode structure 140, and failure of the light-emitting device due to the intrusion of moisture.

In this embodiment, the second blocking layer 152 is an aluminum oxide ($Al_2O_3$) layer that is formed by atomic layer deposition (ALD). The aluminum oxide second blocking layer 152 is more compact than the insulation layer 160, and thus is capable of preventing corrosion of the electrode structure which would cause metal migration.

Referring back to FIG. 3, in this embodiment, the first blocking layer 151 is generally similar to the second blocking layer 152 shown in FIG. 4, except for the following differences. The first blocking layer 151 is divided into a first section 151a, a second section 151b, and a third section 151c. The second section 151b is in contact with the first type semiconductor layer 121 of the light-emitting laminated structure 120, particularly, the second section 151b is in surface contact with the first type semiconductor layer 121. Furthermore, the first section 151a extends downward from the side wall of the first electrode 141 to the second section 151b that is located on a portion of a top surface of the first type semiconductor layer 121 adjacent to the side wall of the first electrode 141. The second section 151b of the first blocking layer 151 of the blocking layer structure 150 has a width (W2) of greater than 0.5 µm. Since it is not necessary to consider the impact of the width (W2) on the light extraction efficiency of the light-emitting device, as long as the width (W2) is greater than 0.5 µm, the intrusion of moisture that may cause the corrosion of chromium, nickel, aluminum, and gold of the first electrode 141 of the electrode structure 140 may be avoided effectively.

The insulation layer 160 is formed with a plurality of openings that are located above the first electrode 141 and the second electrode 142 and are communicated with the top surface of the first electrode 141 and the top surface of the second electrode 142. Thus, a portion of the top surface of the first electrode 141 and a portion of the top surface of the second electrode 142 are exposed from the insulation layer 160 for wire bonding. In this embodiment, the insulation layer 160 has a thickness ranging from 100 nm to 500 nm. In certain embodiments, the thickness of the insulation layer 160 ranges from 150 nm to 300 nm.

The insulation layer 160 is made from a material from the group consisting of silicon dioxide ($SiO_2$), silicon nitride (SiN), aluminum oxide ($Al_2O_3$), and combinations thereof, but is not limited thereto. In this embodiment, the insulation layer 160 is a silicon dioxide layer that has superior physical characteristics and superior chemical stability, and therefore is capable of protecting the current spreading layer 130, the light-emitting laminated structure 120, and the electrode structure 140. In some embodiments, the insulation layer 160 may be formed as a multi-layered structure (e.g., distributed Bragg reflector (DBR)) composed of multiple dielectric film layers with high refractive index and multiple dielectric film layers with low refractive index that are alternately stacked on one another. The dielectric film layers with high refractive index are made from a material selected from the group consisting of titanium dioxide ($TiO_2$), niobium pentoxide ($Nb_2O_5$), tantalum pentoxide ($Ta_2O_5$), hafnium (IV) oxide ($HfO_2$), zirconium dioxide ($ZrO_2$), or any combination thereof, but is not limited thereof; and the dielectric film layers with low refractive index are made from a material selected from the group consisting of silicon dioxide ($SiO_2$), magnesium fluoride ($MgF_2$), aluminum oxide ($Al_2O_5$), silicon oxynitride (SiON), or any combination thereof, but is not limited thereof. By such configuration, the insulation layer 160 may have a superior photo-electronic property.

Figure 5:
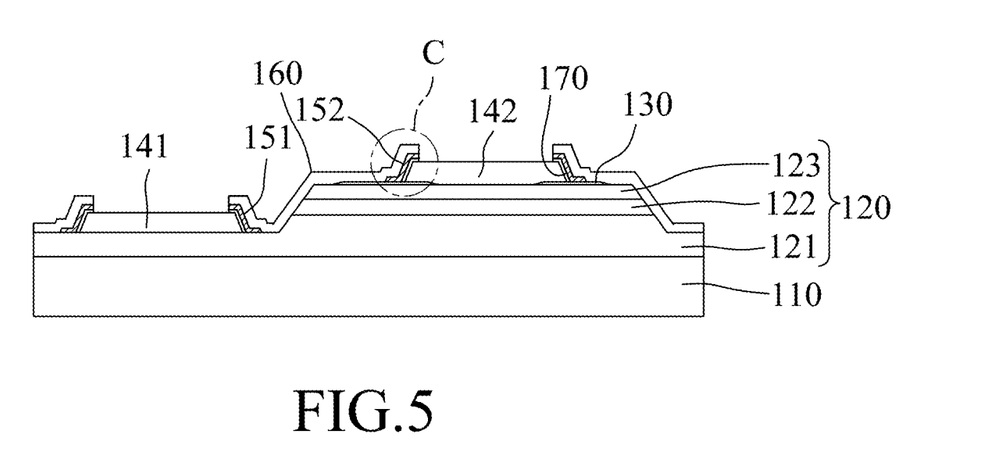
FIG. 5 is a sectional view illustrating a light-emitting device of a second embodiment according to the disclosure.
Figure 6:
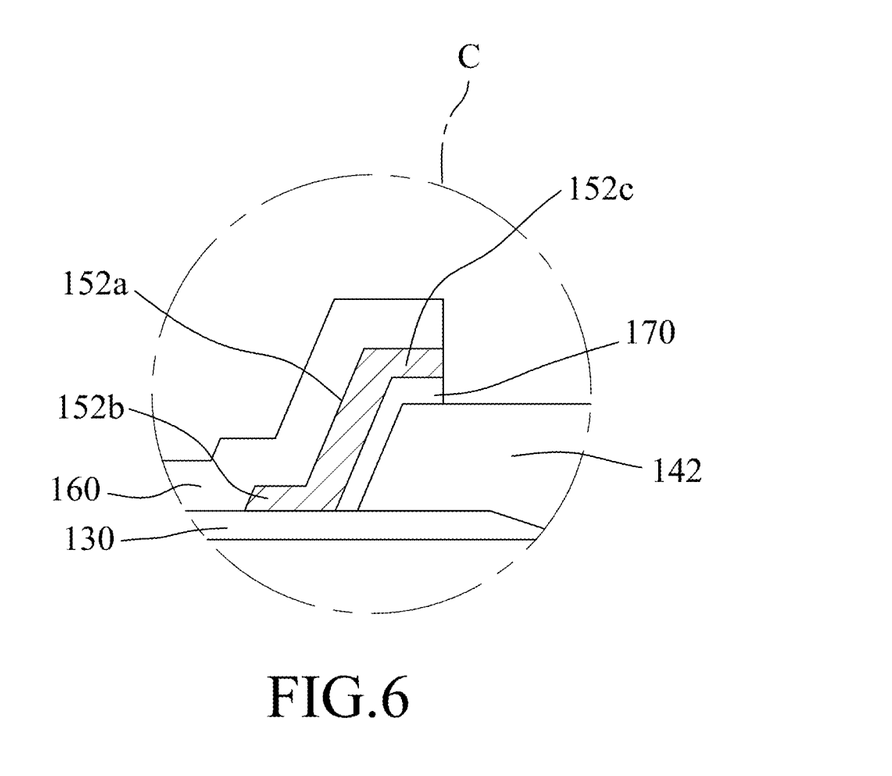
FIG. 6 is an enlarged view of a region C of FIG. 5.

FIGS. 5 and 6 illustrate a light-emitting device of a second embodiment according to the disclosure. FIG. 5 is a sectional view illustrating the light-emitting device of the second embodiment, and FIG. 6 is an enlarged view of a region C of FIG. 5. Referring to FIGS. 5 and 6, the light-emitting device of the second embodiment is generally similar to the aforementioned light-emitting device of the first embodiment except for the following differences.

Referring to FIGS. 5 and 6, the light-emitting device of the second embodiment further includes an adhesive layer 170 that is disposed between the second blocking layer 152 (i.e., the aluminum oxide layer) and the second electrode 142, to improve adhesion therebetween. In some embodiments, referring to FIGS. 5 and 6, the adhesive layer 170 is further disposed between the first blocking layer 151 and the first electrode 141. In particular, the adhesive layer 170 is disposed on the side wall and a portion of the top surface of the second electrode 142, and is in contact with the first section 152a and the third section 152c of the second blocking layer 152, such that the adhesion between the second electrode 142 and the second blocking layer 152 may be enhanced.

In some embodiments, the adhesive layer 170 may be further disposed between the current spreading layer 130 and the second section 152b of the second blocking layer 152, so as to further enhance the adhesion between the second electrode 142 and the second blocking layer 152.

In this embodiment, the adhesive layer 170 is made from a material selected from the group consisting of chromium, titanium, platinum, and combinations thereof, but is not limited thereof.

In other embodiments, in the second blocking layer 152, the second section 152b may be made from aluminum oxide ($Al_2O_3$) and is formed by atomic layer deposition (ALD), and the first section 152a may be made from a metal material. By such configuration, not only the adhesion may be improved, corrosion of the metal material of the second electrode 142 caused by the intrusion of moisture may also be avoided. In such case, the adhesive layer 170 may be omitted.

FIGS. 7 to 11 illustrate a method for producing the light-emitting device of the first embodiment.

Figure 7:
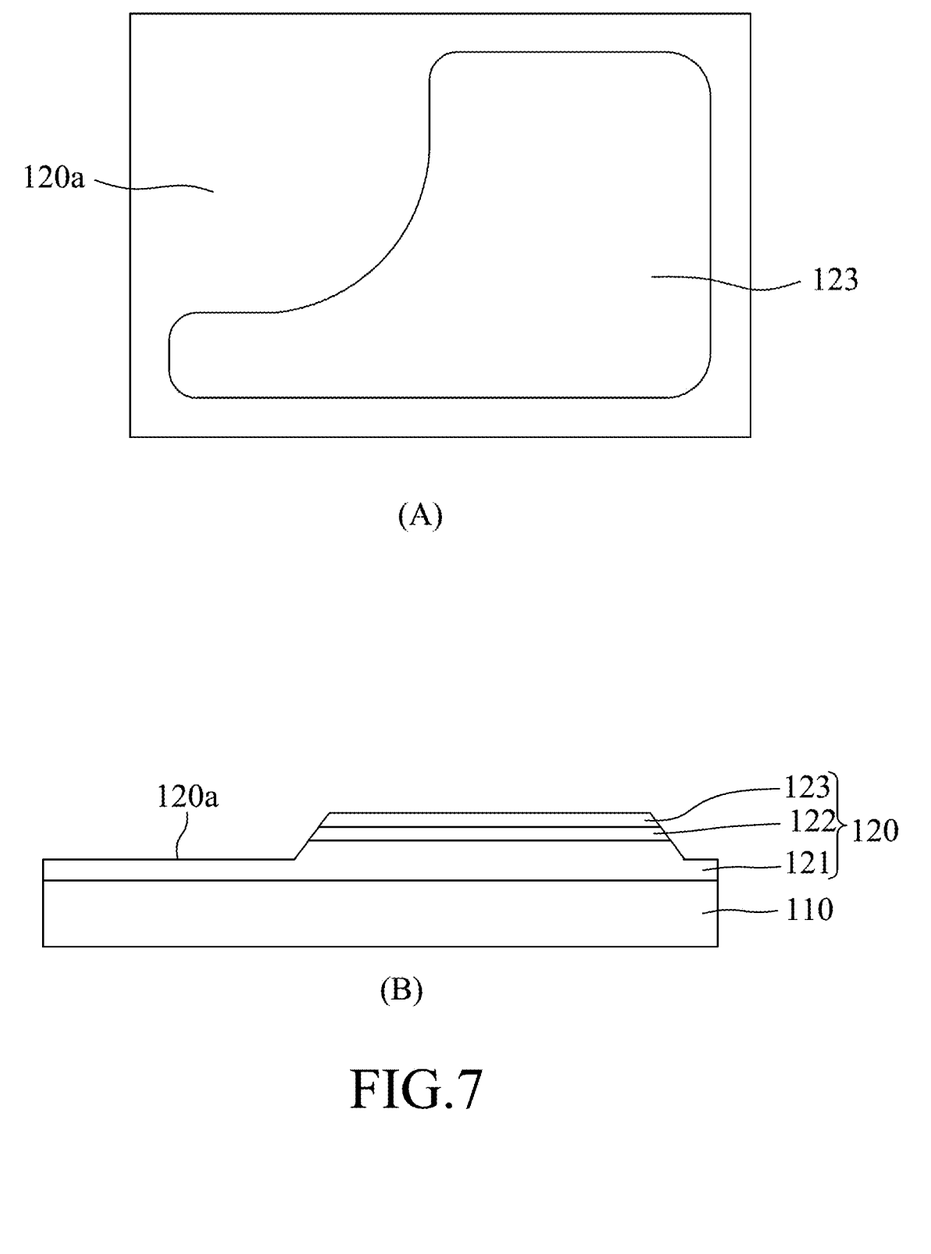
FIGS. 7 to 11 illustrating consecutive steps of a method for producing the light-emitting device of the first embodiment according to the disclosure, wherein (A) denotes a top view, and (B) denotes a sectional view.

Referring to FIG. 7, firstly, the light-emitting laminated structure 120 including the first type semiconductor layer 121, the active layer 122, and the second type semiconductor layer 123 is formed on the substrate 110. Then, the light-emitting laminated structure 120 is etched from the second type semiconductor layer 123 side toward the first type semiconductor layer 121 side until the first type semiconductor layer 121 is exposed, so that the light-emitting laminated structure 120 is formed with a recess structure 120a. Furthermore, a peripheral portion of the light-emitting laminated structure 120 may be optionally etched or removed, so as to expose a peripheral portion of the substrate 110 (not shown in the Figure), which may facilitate the subsequent dicing process.

Figure 8:
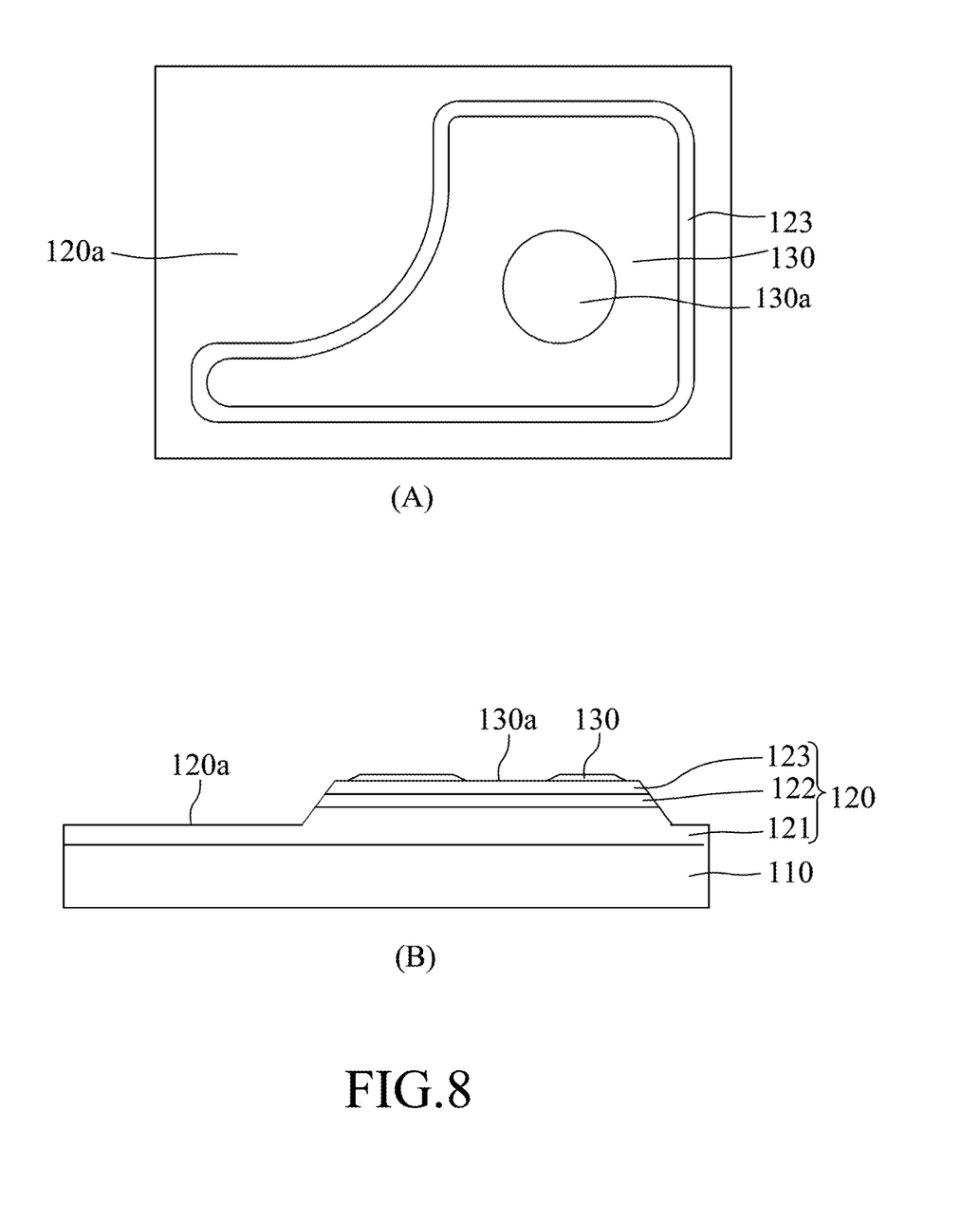

Referring to FIG. 8, the current spreading layer 130 is formed on the second type semiconductor layer 123 of the light-emitting laminated structure 120. The current spreading layer 130 is used to enhance current spreading, so as to improve the reliability of the light-emitting device. Then, the opening 130a is formed in the current spreading layer 130, so as to expose a portion of the second type semiconductor layer 123. In FIG. 8, the current spreading layer 130 is not in contact with the first type semiconductor layer 121 of the light-emitting laminated structure 120.

Figure 9:
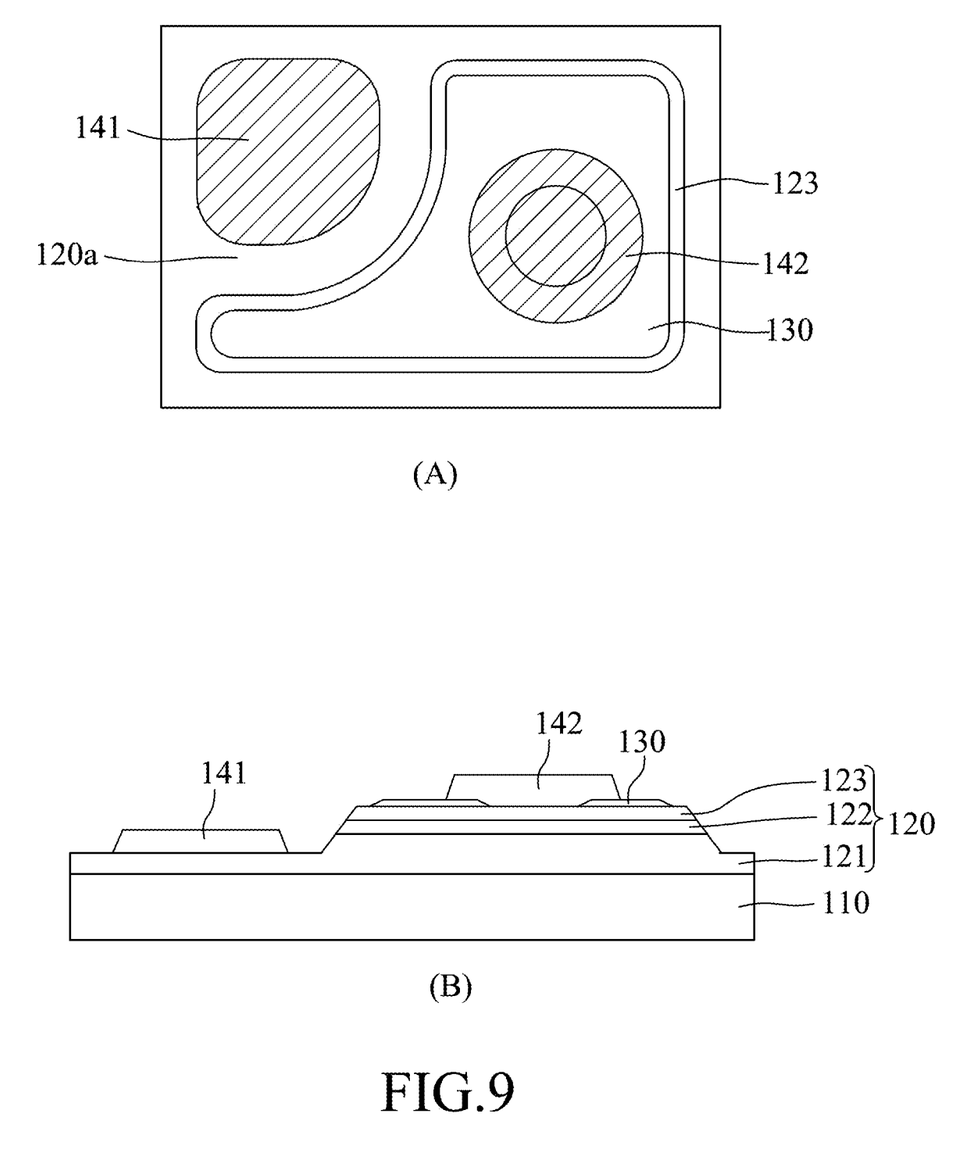

Referring to FIG. 9, the first electrode 141 is formed on the first type semiconductor layer 121, and the second electrode 142 is formed on the second type semiconductor layer 123 and the current spreading layer 130. The second electrode 142 fills the opening 130a of the current spreading layer 130, so as to improve adhesion between the second electrode 142 and the current spreading layer 130, thereby avoiding peeling of the second electrode 142. In FIG. 9(A), the first electrode 141 and the second electrode 142 are represented by parallel shading lines.

Figure 10:
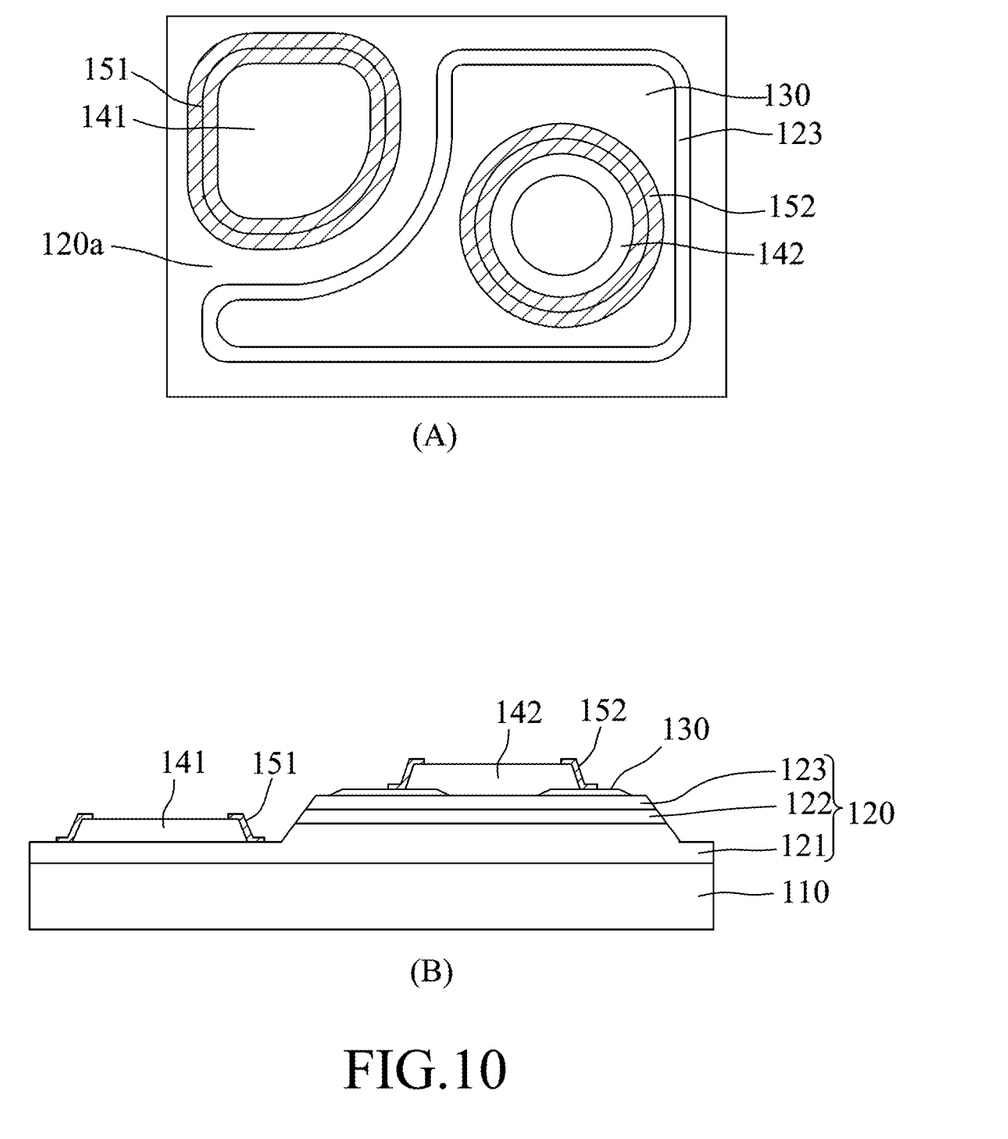

Referring to FIG. 10, the first blocking layer 151 is formed on the side wall of the first electrode 141, the portion of the top surface of the first electrode 141 and the portion of the first type semiconductor layer 121 adjacent to the first electrode 141; and the second blocking layer 152 is formed on the side wall of the second electrode 142, the portion of the top surface of the second electrode 142 adjacent to the side wall of the second electrode 142, and the portion of the current spreading layer 130 adjacent to the bottom of the second electrode 142. In FIG. 10(A), the first blocking layer 151 and the second blocking layer 152 are represented by parallel shading lines.

Figure 11:
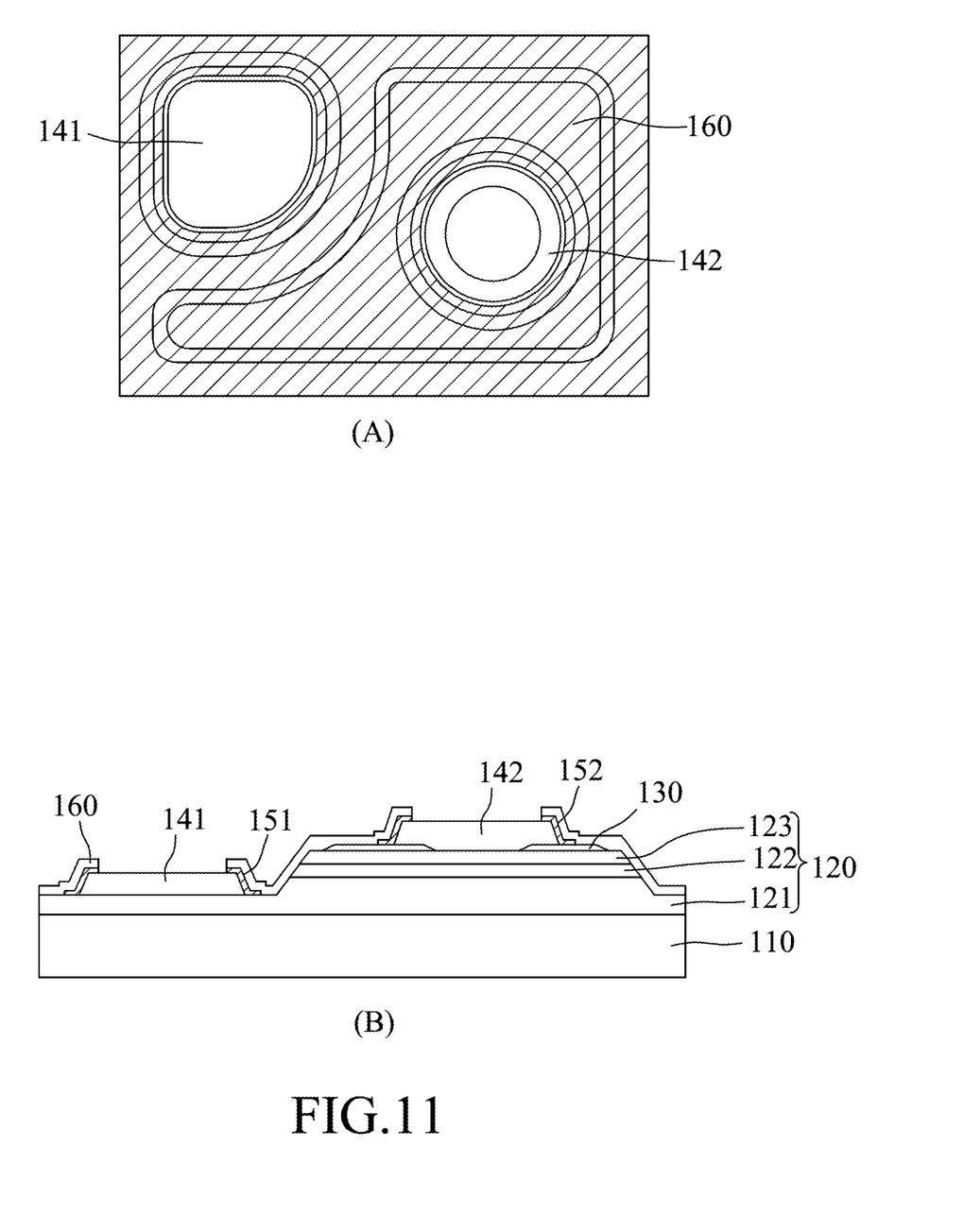

Referring to FIG. 11, the insulation layer 160 is formed to cover the light-emitting laminated structure 120, the side wall and the portion of the top surface of the first electrode 141, the side wall and the portion of the top surface of the second electrode 142, the current spreading layer 130, the first blocking layer 151, and the second blocking layer 152. In FIG. 11(A), the insulation layer 160 is represented by parallel shading lines.

In sum, by having the blocking layer structure 150 between the electrode structure 140 and the insulation layer 160, in which the first section 151a, 152a of the blocking layer structure 150 is interposed between the side wall of the electrode structure 140 and the insulation layer 160, and the second section 151b, 152b is interposed between the insulation layer 160 and the light-emitting laminated structure 120, the intrusion of moisture and electrolyte to the electrode structure 140 may be avoided. Therefore, migration of chromium, nickel, aluminum, silver, gold, from the electrode structure 140 may be prevented and problems such as current leakage and short circuit of the light-emitting device may be alleviated.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
   a light-emitting laminated structure which includes
      a first type semiconductor layer,
      a second type semiconductor layer,
      an active layer interposed between said first type semiconductor layer and said second type semiconductor layer, and configured to emit light,
   an electrode structure disposed on said light-emitting laminated structure,
   an insulation layer disposed on said light-emitting laminated structure,
   a blocking layer structure interposed between said electrode structure and said insulation layer,
   wherein said blocking layer structure has a first section and a second section that forms a continuous structure with said first section, said first section being interposed between a side wall of said electrode structure and said insulation layer, and said second section being interposed between said insulation layer and said light-emitting laminated structure,
   wherein said second section of said blocking layer structure has a width ranging from 0.5 μm to 15 μm, and
   wherein said blocking layer structure is made from a material selected from the group consisting of platinum, palladium, osmium, iridium, ruthenium, rhodium, and combinations thereof.

2. The light-emitting device as claimed in claim 1, wherein in said blocking layer structure, said first section extends downward from said side wall of said electrode structure to said second section that is located on a portion of a top surface of said light-emitting laminated structure adjacent to said side wall.

3. The light-emitting device as claimed in claim 1, further comprising a current spreading layer disposed on said second type semiconductor layer of said light-emitting laminated structure,
   wherein said blocking layer structure includes a first blocking layer and a second blocking layer, each of said first blocking layer and said second blocking layer is divided into said first section and said second section,
   wherein said electrode structure includes a first electrode that is disposed on said first type semiconductor layer of said light-emitting laminated structure, and a second electrode that is disposed on said current spreading layer and contacts said second type semiconductor layer of said light-emitting laminated structure by extending through said current spreading layer,
   wherein said first blocking layer is in contact with said first electrode, and said second blocking layer is in contact with said second electrode, and
   wherein said second section of said first blocking layer is in contact with said first type semiconductor layer, and said second section of said second blocking layer is in contact with said current spreading layer.

4. The light-emitting device as claimed in claim 3, wherein said second section of said first blocking layer is in surface contact with said first type semiconductor layer, and said second section of said second blocking layer is in surface contact with said current spreading layer.

5. The light-emitting device as claimed in claim 1, wherein said blocking layer structure further has a third section that is connected with said first section and covers a portion of a top surface of said electrode structure, and said third section has a width of not greater than 5 μm.

6. The light-emitting device as claimed in claim 1, wherein in said blocking layer structure, each of said first section and said second section has a thickness of not less than 30 Å.

7. The light-emitting device as claimed in claim 1, wherein in said blocking layer structure, a thickness of said second section is not less than a thickness of said first section.

8. The light-emitting device as claimed in claim 1, wherein in said blocking layer structure, a width of said second section is not less than 5 times of a thickness of said first section.

9. The light-emitting device as claimed in claim 1, further comprising a current spreading layer disposed on said second type semiconductor layer of said light-emitting laminated structure, wherein
   said electrode structure has a first metal layer, a second metal layer, and a third metal layer, said second metal layer being disposed between said first and third metal layers,
   said first metal layer is in contact with said first type semiconductor layer or said current spreading layer,
   said third metal layer covers said first metal layer and said second metal layer, and is in contact with said blocking layer structure.

10. The light-emitting device as claimed in claim 9, wherein said first metal layer is made from a material selected from the group consisting of chromium, titanium, nickel, and combinations thereof,
   said second metal layer is made from a material selected from the group consisting of aluminum, silver, an aluminum-silver alloy, and platinum, and
   said third metal layer is made from gold.

11. The light-emitting device as claimed in claim 3, wherein said current spreading layer has a thickness ranging from 50 nm to 300 nm.

12. The light-emitting device as claimed in claim 1, wherein said insulation layer has a thickness ranging from 150 nm to 300 nm.

* * * * *